(12) United States Patent
Takatsuki

(10) Patent No.: US 8,076,252 B2
(45) Date of Patent: Dec. 13, 2011

(54) SUBSTRATE PROCESSING METHOD AND SUBSTRATE PROCESSING APPARATUS

(75) Inventor: Koichi Takatsuki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 523 days.

(21) Appl. No.: 11/997,045

(22) PCT Filed: Jul. 28, 2006

(86) PCT No.: PCT/JP2006/315014
§ 371 (c)(1),
(2), (4) Date: Mar. 24, 2008

(87) PCT Pub. No.: WO2007/013605
PCT Pub. Date: Feb. 1, 2007

(65) Prior Publication Data
US 2010/0144159 A1  Jun. 10, 2010

(30) Foreign Application Priority Data
Jul. 28, 2005  (JP) .................. 2005-218138

(51) Int. Cl.
*H01L 21/00* (2006.01)
(52) U.S. Cl. ......... 438/799; 257/E21.214; 257/E21.324; 430/30; 118/697
(58) Field of Classification Search .................. 438/799; 118/697; 257/E21.214, E21.211, E21.324, 257/E21.328, E21.333; 700/121; 430/30
See application file for complete search history.

(56) References Cited

U.S. PATENT DOCUMENTS

| 6,313,017 B1 * | 11/2001 | Varhue ..................... 438/503 |
| 2006/0201414 A1 * | 9/2006 | Brabant et al. ............... 117/89 |
| 2006/0231032 A1 * | 10/2006 | Murakami et al. ....... 118/723 R |

FOREIGN PATENT DOCUMENTS

| JP | 10-294287 | * 11/1998 |
| JP | 2001 308084 | 11/2001 |
| JP | 2002 164399 | 6/2002 |
| JP | 2003-77863 | * 4/2003 |

OTHER PUBLICATIONS

Translation of JP 10-294287, Kawakami (Nov. 1998), 21 pages.*

* cited by examiner

*Primary Examiner* — Caridad Everhart
(74) *Attorney, Agent, or Firm* — Oblon, Spivak, McClelland, Maier & Neustadt, L.L.P.

(57) ABSTRACT

In a substrate processing method, a substrate to be processed is mounted on a mounting table in a processing chamber of a substrate processing apparatus, and while heating the substrate by a heating unit through the mounting table to a processing temperature of 700° C. or higher, the substrate is processed. The substrate to be processed is loaded into the processing chamber, a first preliminary heating is performed until the substrate reaches a prescribed temperature while being mounted on the mounting table. Then, substrate supporting pins of the mounting table are elevated, and a second preliminary heating is performed in a state where the substrate is held on the substrate supporting pins. Then, the substrate supporting pins are moved down to mount the substrate on the mounting table and a process such as plasma oxidation is performed thereon.

15 Claims, 10 Drawing Sheets

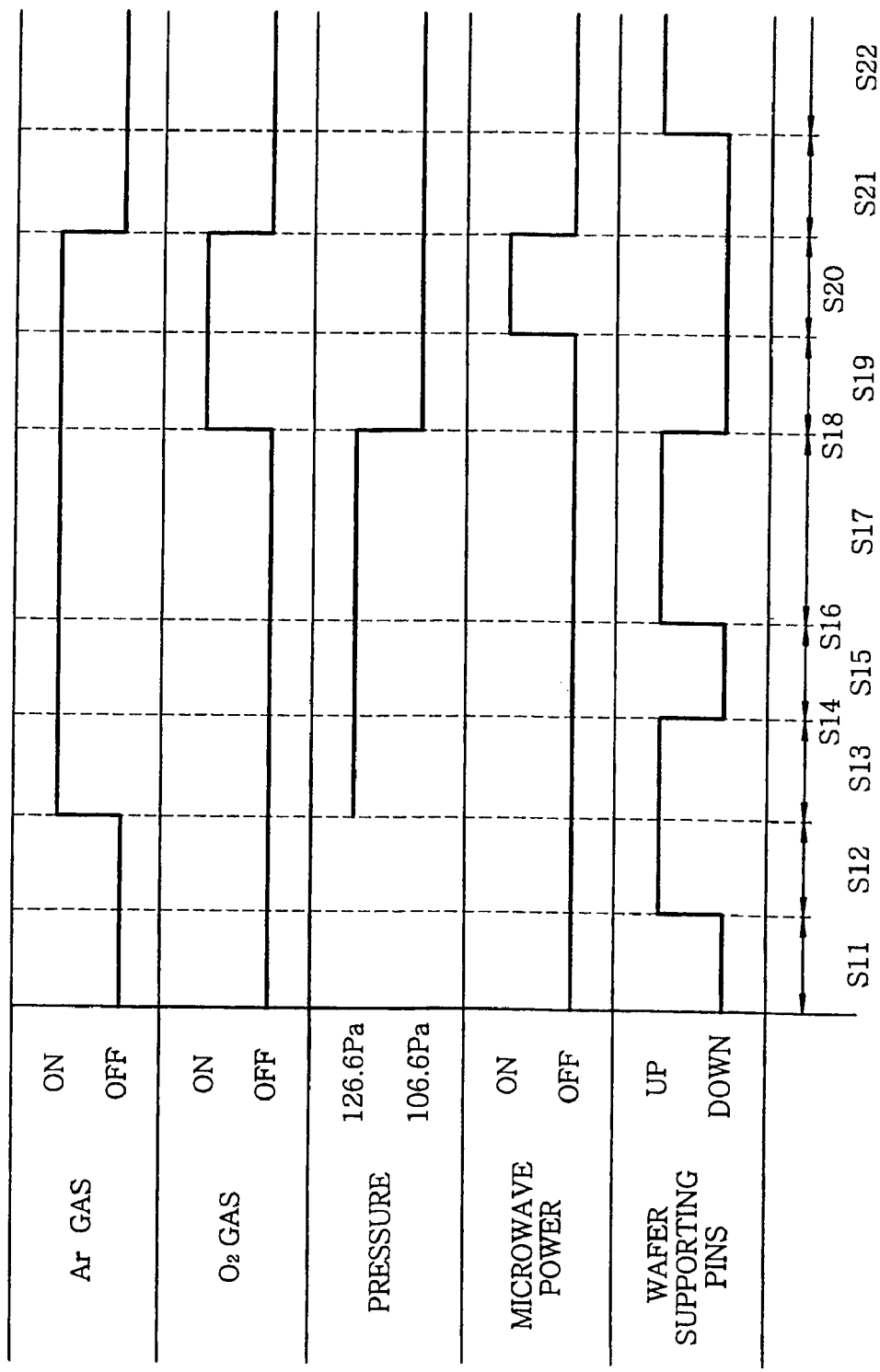

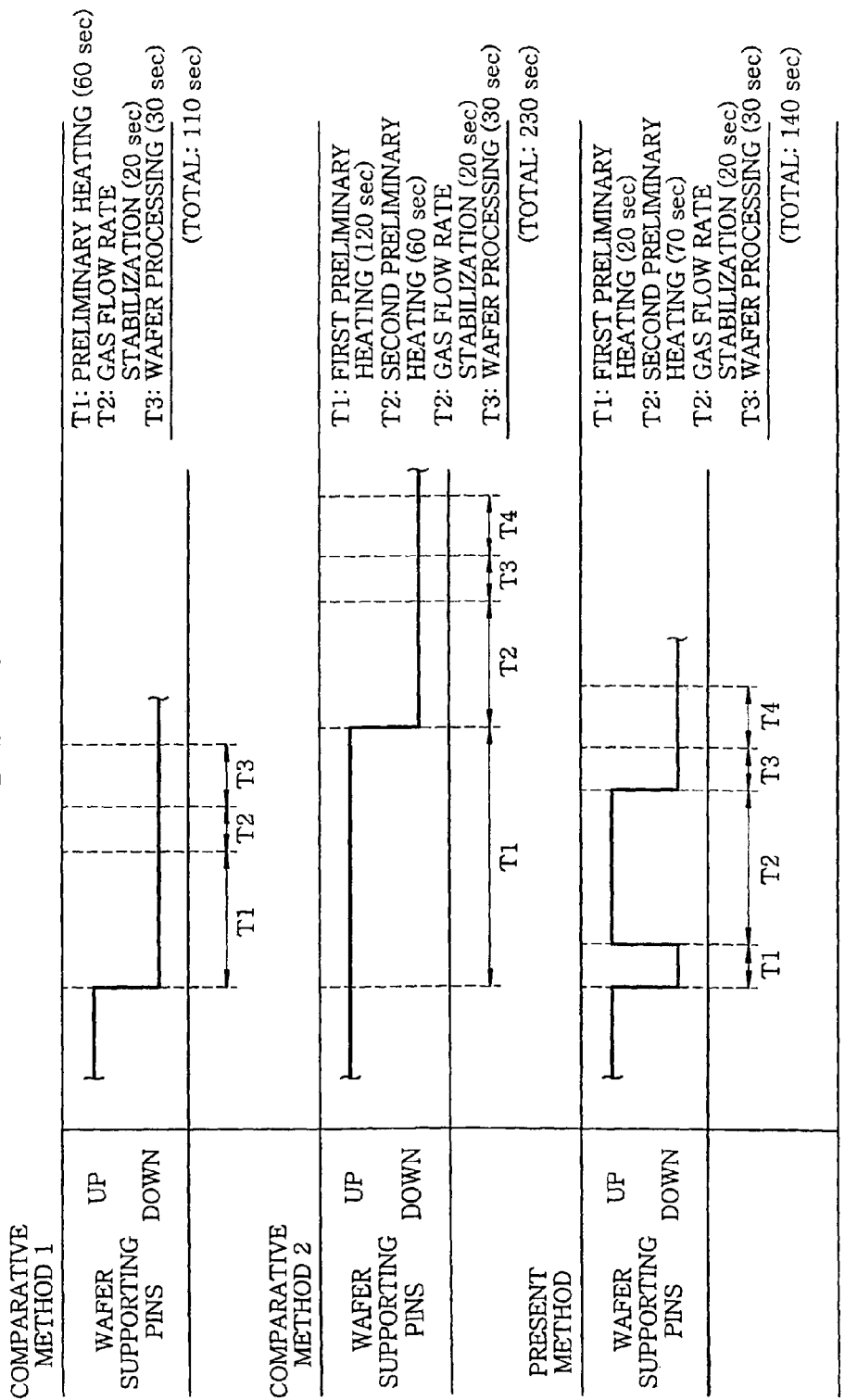

SUBSTRATE PROCESSING METHOD AND SUBSTRATE PROCESSING APPARATUS

FIELD OF THE INVENTION

The present invention relates to a substrate processing method; and, more particularly, to a substrate processing method for performing, e.g., a film forming process on a target substrate such as a semiconductor wafer.

BACKGROUND OF THE INVENTION

A film forming apparatus for performing a film forming process on a semiconductor wafer, which is a target substrate to be processed, by, for example, a chemical vapor deposition (CVD) method includes a susceptor serving as a substrate mounting table for mounting the wafer thereon, and the susceptor has a heating unit therein. Various film forming reactions are carried out while heating the wafer indirectly by means of heating the susceptor. The susceptor is made of a ceramic-based material such as AlN having a high thermal conductivity, and is capable of heating the target substrate up to a processing temperature of, for example, about 700° C. or higher.

Recently, a wafer size has increased to about 200 mm to 300 mm, and with the increase of the wafer size, the wafer tends to be easily warped due to a temperature variation during a heating process (temperature increasing process) for the film formation. Once the wafer is warped, misalignment of the wafer would be caused while the wafer is being transferred, and a wafer edge portion or the like would come into a contact with the susceptor, resulting in a damage or a particle contamination. Thus, it is very important to prevent the wafer from being warped in the process of heating the wafer.

In this regard, there is proposed a CVD film forming method which includes performing a first preliminary heating process while maintaining the wafer on substrate (wafer) supporting pins after the wafer is loaded into a processing chamber; and then performing a second preliminary heating process after the substrate supporting pins are lowered and the wafer is loaded on the mounting table (see, for example, Japanese Patent Laid-open Publication No. 2003-77863).

The method of performing two steps of preliminary heating processes disclosed in Japanese Patent Laid-open Publication No. 2003-77863 is advantageous in that the warpage of the substrate is prevented. However, since the preliminary heating process is performed in the state the wafer is distanced apart from the mounting table by being sustained on the wafer supporting pins for the purpose of avoiding a rapid temperature rise of the wafer, it takes time to complete the preliminary heating. Particularly, if a processing temperature is high above 700° C., a reduction of a throughput is inevitable. Thus, these problems need to be improved.

SUMMARY OF THE INVENTION

It is, therefore, an object of the present invention to provide a substrate processing method capable of preventing a warpage deformation of a substrate during a temperature increasing process when processing the substrate at a high temperature of 700° C. or above, while realizing the processing at a high throughput.

In accordance with a first aspect of the present invention, there is provided a substrate processing method including: performing a first preliminary heating process on a target substrate loaded on a mounting table in a processing chamber of a substrate processing apparatus; performing a second preliminary heating process while maintaining the target substrate on substrate supporting pins of the mounting table after elevating the substrate supporting pins; and processing the target substrate while heating the substrate at a processing temperature of about 700° C. or higher after lowering the substrate supporting pins to mount the target substrate on the mounting table.

In accordance with a second aspect of the present invention, there is provided a substrate processing method including: performing a first preliminary heating process on a target substrate, which is loaded on a mounting table in a processing chamber of a substrate processing apparatus, for a preset time period within a temperature range in which a warpage of the substrate does not take place; performing a second preliminary heating process while maintaining the target substrate on substrate supporting pins of the mounting table after elevating the substrate supporting pins within a temperature range in which the target substrate is likely to warp; and processing the target substrate while heating the substrate at a processing temperature of about 700° C. or higher after lowering the substrate supporting pins to mount the target substrate on the mounting table.

In accordance with a third aspect of the present invention, there is provided a substrate processing method including: a first step of loading a target substrate into a processing chamber of a substrate processing apparatus and locating the target substrate at a first position; a second step of shifting the target substrate from a first position to a second position and heating the substrate; a third step of shifting the target substrate from the second position to a third position and heating the substrate; and a fourth step of shifting the target substrate from the third position to a fourth position and processing the substrate while heating the substrate at a processing temperature of about 700° C. or higher.

In the third aspect, the second position and the fourth position may refer to a position where the target substrate is mounted on a mounting table, and the third position may refer to a position where the target substrate is sustained above the mounting table.

In the first and second aspects, it is preferable that the target substrate is a silicon substrate and a heating temperature of the first preliminary heating process is lower than about 600° C.

In the third aspect, it is preferable that the target substrate is a silicon substrate and a heating temperature in the second step is lower than about 600° C.

In the first to third aspects, it is preferable that the processing temperature ranges from about 700° C. to 1100° C. Further, the substrate processing apparatus may be a plasma processing apparatus which processes the target substrate by making a plasma of a processing gas act on the target substrate. In this case, the plasma is preferably generated by introducing a microwave into the processing chamber through a planar antenna having a number of slots.

In the first to third aspects, it is preferable that a processing pressure is higher than about 53.3 Pa and lower than or equal to about 101325 Pa.

In the first and second aspects, it is preferable that the target substrate is heated up to a first temperature in the first preliminary heating process and is heated up to a second temperature in the second preliminary heating process, the first temperature being lower than the second temperature. In this case, more preferably, the first temperature is lower than about 600° C. and the second temperature is higher than about 600° C.

Preferably, the temperature of the target substrate is increased under a first pressure condition in the first preliminary heating process, while the temperature of the target substrate is increased under a second pressure condition in the second preliminary heating process, the first pressure condition being lower than the second pressure condition.

Preferably, the temperature of the target substrate is increased under a same processing condition both in the first preliminary heating process and in the second preliminary heating process.

Further, it is preferable that the second preliminary heating process includes: warping the target substrate by heating the target substrate for a preset time period; and straightening the warped target substrate by heating the target substrate for a predetermined time period.

In accordance with a fourth aspect of the present invention, there is provided a computer executable control program, which controls, when executed, a substrate processing apparatus to perform a substrate processing method including: performing a first preliminary heating process on a target substrate loaded on a mounting table in a processing chamber of the substrate processing apparatus; performing a second preliminary heating process while maintaining the target substrate on substrate supporting pins of the mounting table after elevating the substrate supporting pins; and processing the target substrate while heating the substrate at a processing temperature of about 700° C. or higher after lowering the substrate supporting pins to mount the target substrate on the mounting table.

In accordance with a fifth aspect of the present invention, there is provided a computer readable storage medium for storing therein a computer executable control program, wherein, when executed, the control program controls a substrate processing apparatus to perform a substrate processing method including: performing a first preliminary heating process on a target substrate loaded on a mounting table in a processing chamber of the substrate processing apparatus; performing a second preliminary heating process while maintaining the target substrate on substrate supporting pins of the mounting table after elevating the substrate supporting pins; and processing the target substrate while heating the substrate at a processing temperature of about 700° C. or higher after lowering the substrate supporting pins to mount the target substrate on the mounting table.

In accordance with a sixth aspect of the present invention, there is provided a plasma processing apparatus including: a vacuum-evacuable processing chamber including a mounting table for mounting thereon a target substrate; substrate supporting pins protrusible above and retractable below a mounting surface of the mounting table, for supporting the target substrate thereon when the substrate supporting pins protrudes above the mounting surface; and a control unit for controlling a substrate processing method to be carried out, the method comprising: performing a first preliminary heating process on the target substrate loaded on the mounting table in the processing chamber; performing a second preliminary heating process while maintaining the target substrate on the substrate supporting pins of the mounting table after elevating the substrate supporting pins; and processing the target substrate while heating the substrate at a processing temperature of about 700° C. or higher after lowering the substrate supporting pins to mount the target substrate on the mounting table.

In accordance with the substrate processing method of the present invention, after performing the first preliminary heating process on the target substrate loaded on the mounting table, the substrate supporting pins of the mounting table are elevated and the second preliminary heating process is then performed while maintaining the target substrate on the substrate supporting pins. In the second preliminary heating process, since the target substrate is supported on the substrate supporting pins not on the mounting table, the temperature of the substrate passes a temperature range in which the substrate is likely to warp in the temperature increasing through the second preliminary heating process. Accordingly, even if the substrate is warped, it is possible to avoid damage or particle contamination thereof.

Furthermore, the warpage of the substrate can be eliminated during the second preliminary heating process in which the temperature of the substrate is smoothly increased while being supported on the substrate supporting pins. Accordingly, even in case of a large substrate, the warpage of the substrate can securely prevented.

In addition, by performing the first preliminary heating process while the substrate is mounted on the mounting table, the temperature increasing time in this temperature range becomes shortened, thereby improving a throughput of the processing.

BRIEF DESCRIPTION OF THE DRAWINGS

FIG. 5 is a timing chart corresponding to the flowchart of FIG. 3;

FIG. 6 offers a timing chart showing locations of wafer supporting pins in the present method and a comparative method in parallel manner;

DETAILED DESCRIPTION OF THE EMBODIMENT

Figure 1:
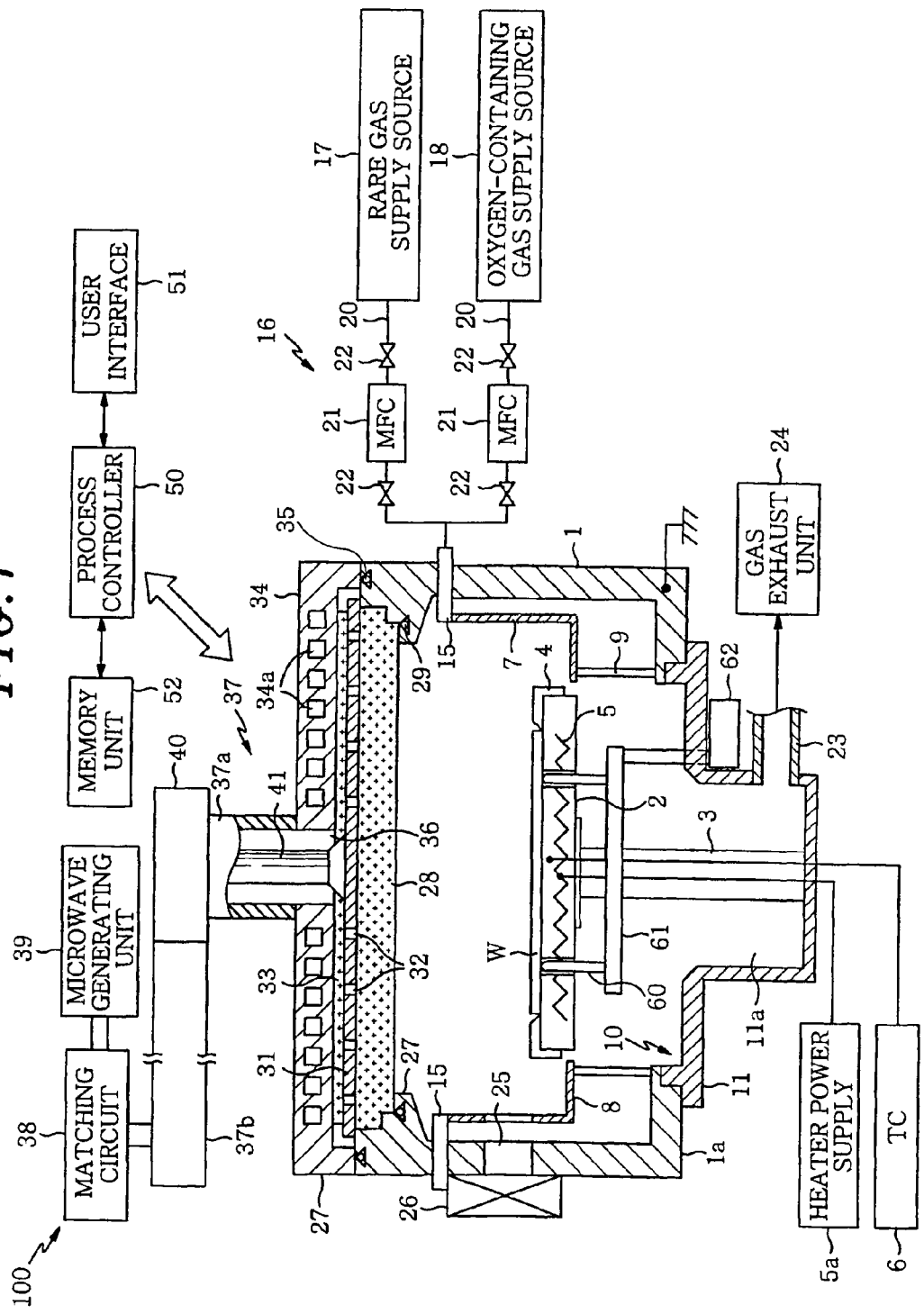
FIG. 1 is a schematic cross sectional view showing an exemplary plasma processing apparatus to which the present invention is applicable.

Hereinafter, an embodiment of the present invention will be described in detail with reference to the accompanying drawings. FIG. 1 provides a schematic cross sectional view showing an exemplary plasma processing apparatus 100 to which the present invention is appropriately applicable. The plasma processing apparatus 100 is configured as a RLSA (Radial Line Slot Antenna) microwave plasma processing apparatus capable of generating a high-density microwaveexcited plasma having a low electron temperature by way of generating the plasma while introducing a microwave into a processing chamber through a planar antenna having a number of slots, especially, an RLSA antenna. With this plasma processing apparatus 100, a plasma process can be carried out by using a plasma having a plasma density ranging from about $1 \times 10^{10}$ to $5 \times 10^{12}/cm^2$ and an electron temperature ranging from about 0.7 to 2 eV.

In the present embodiment, the plasma processing apparatus 100 is configured as a plasma oxidizing apparatus which performs an oxidation process by using an oxygen-containing gas plasma. This plasma processing apparatus can be appropriately employed in a manufacturing process of various semiconductor devices such as a MOS (Metal Oxide Semiconductor) transistor, a MISFET (Metal Oxide Filed Effect Transistor), and the like, for the purpose of forming gate insulating films and the like.

The plasma processing apparatus 100 includes a substantially cylindrical chamber 1 which is airtightly sealed and grounded. A circular opening 10 is provided at a substantially central portion of a bottom wall 1a of the chamber 1, and a gas exhaust chamber 11 communicating with the opening 10 is provided at the bottom wall 1a and protruded downward therefrom.

A susceptor 2 made of ceramic, e.g., AlN, is disposed in the chamber 1 to horizontally support thereon a wafer W, which is a substrate to be processed. The susceptor 2 is supported by a cylindrical supporting member 3 made of ceramic, e.g., AlN, and extending upward from a central bottom portion of the gas exhaust chamber 11. A guide ring for guiding the wafer W is disposed on the outer peripheral portion of the susceptor 2.

Further, a resistance heater 5 is embedded in the susceptor 2. The heater 5 heats the susceptor 2 by being supplied with a power from a heater power supply 5a, and the wafer W to be processed is heated by the heated susceptor 2. A thermocouple 6 is connected to the susceptor 2, and the temperature of the wafer W can be controlled in a range from a room temperature to about 1100° C. for example.

The susceptor 2 is provided with three wafer supporting pins 60 (only two of them are shown) which serve to move up and down the wafer W while supporting it. The wafer supporting pins 60 are configured to be protrusible above and retractable below the surface of the susceptor 2. The wafer supporting pins 60 are fixed on a supporting plate 61 and are moved up and down by a driving mechanism 62 such as an air cylinder via the supporting plate 61.

A cylindrical liner 7 made of quartz is provided on an inner periphery of the chamber 1 to prevent metal contamination caused by constituent materials of the chamber. Moreover, a baffle plate 8 provided with a number of through holes (not shown) is annularly provided at an outer peripheral side of the susceptor 2 to evacuate the chamber 1 uniformly. The baffle plate 8 is supported by a plurality of supporting columns 9.

An annular gas introducing member 15 is provided in a sidewall of the chamber 1, and a gas supply system 16 is connected to the gas introducing member 15. The gas introducing member 15 may be disposed in a nozzle shape or a shower shape. The gas supply system 16 includes, for example, a rare gas supply source 17 and an oxygen-containing gas supply source 18, and a rare gas and an oxygen-containing gas are supplied to the gas introducing member 15 through respective gas lines 20 and then introduced into the chamber 1 through the gas introducing member 15. Each of the gas lines 20 is provided with a mass flow controller 21 and opening/closing valves 22 disposed at upstream and downstream sides of the mass flow controller 21.

As the oxygen-containing gas, $O_2$ gas can be used, for example. Further, it is also possible to add, for example, $H_2$ gas to the $O_2$ gas, and in such case, the $O_2$ gas and the $H_2$ gas are supplied from respective gas supply sources. As the rare gas, Ar gas, Kr gas, Xe gas, He gas or the like can be used, for example.

A gas exhaust line 23 is connected to a side surface of the exhaust chamber 11, and a gas exhaust unit 24 having a high speed vacuum pump is connected to the gas exhaust line 23. By operating the gas exhaust unit 24, a gas in the chamber 1 is uniformly discharged into a space 11a of the exhaust chamber 11 via the baffle plate 8 and is then exhausted outside through the gas exhaust line 23. Accordingly, the chamber 1 can be rapidly depressurized to a predetermined vacuum level, e.g., about 0.133 Pa.

At the sidewall of the chamber 1, there are provided a loading/unloading port 25 through which the wafer W is transferred between the chamber 1 and a transfer chamber (not shown) disposed adjacent to the plasma processing apparatus 100; and a gate valve 26 for opening and closing the loading/unloading port 25.

The chamber 1 has an opening at its top, and a ring-shaped upper plate 27 is connected to the opening. A lower part of the inner periphery of the upper plate 27 is inwardly protruded to form an annular supporting portion 27a. A microwave transmitting plate 28 made of a dielectric material, e.g., quartz or ceramic such as $Al_2O_3$, AlN, or the like, is airtightly disposed on the supporting portion 27a via a seal member 29 to allow a microwave to pass therethrough. Accordingly, the inside of the chamber 1 is hermetically kept.

A circular plate-shaped planar antenna member 31 is provided on the transmitting plate 28 to face the susceptor 2. The planar antenna member 31 is held by a top end of the sidewall of the chamber 1. The planar antenna member 31 is made of aluminum or copper plate plated with gold or silver, and it is provided with a plurality of slot-shaped microwave radiation holes 32 formed therethrough in a certain pattern.

Figure 2:
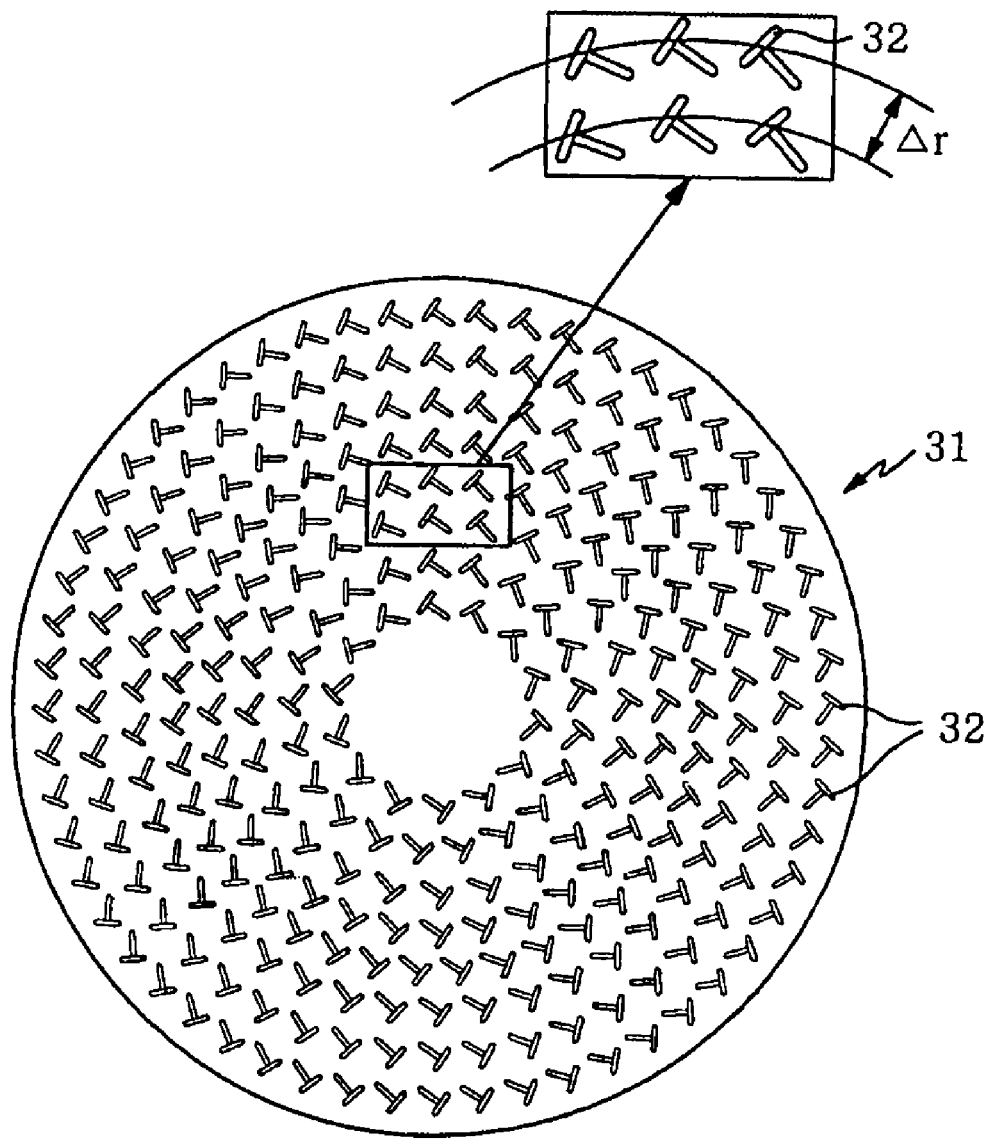
FIG. 2 illustrates a planar antenna member.

Each hole 32 has, for example, an elongated shape as shown in FIG. 2, and, typically, every two neighboring holes are arranged in a T-shape. These microwave radiation holes 32 are concentrically arranged. The length of each hole 32 and an arrangement interval between the holes 32 are determined depending on a wavelength $\lambda_g$ of the microwave. For example, the microwave radiation holes 32 are disposed at an interval of $\lambda_g/4$, $\lambda_g/2$ or $\lambda_g$. In FIG. 2, a radial interval between the adjacent holes 32 concentrically arranged is defined as $\Delta r$. Further, each microwave radiation hole 32 may have another shape such as a circular shape, an arc shape and the like, and the arrangement pattern of the holes 32 is not limited to the concentric circular pattern exemplified herein but they may be arranged in, e.g., a spiral pattern, a radial pattern or the like.

On a top surface of the planar antenna member 31, there is disposed a retardation member 33 having a dielectric constant greater than that of a vacuum. The wavelength of a microwave becomes long under vacuum, and the retardation member 33 functions to shorten the wavelength of the microwave to thereby control the plasma. Further, the planar antenna member 31 and the transmitting plate 28 may be configured to be either in contact with each other or distanced apart from each other, and so are the retardation member 33 and the planar antenna member 31.

On a top surface of the chamber 1, a shield cover 34 made of a metal material, for example, aluminum, stainless steel or the like, is provided to cover the planar antenna member 31 and the retardation member 33. A seal member 35 seals a gap between the top surface of the chamber 1 and the shield cover 34. Further, a cooling water path 34a is formed in the shield cover 34. By flowing cooling water through the cooling water path 34a, the shield cover 34, the retardation member 33, the planar antenna member 31, and the transmitting plate 28 are cooled, whereby a deformation of the planar antenna member 31 or damages of the shield cover 34, the retardation member 33 and the transmitting plate 28 can be prevented, thus resulting in a formation of stable plasma. The shield cover 34 is grounded.

The shield cover 34 has an opening 36 in a center of its top wall, and a waveguide 37 is connected to the opening 36. A microwave generating device 39 is connected to an end portion of the waveguide 37 via a matching circuit 38, whereby a microwave having a frequency of, e.g., about 2.45 GHz generated from the microwave generating device 39 is allowed to propagate to the planar antenna member 31 through the waveguide 37. Here, a microwave having a frequency of about 8.35 GHz or about 1.98 GHz can also be used.

The waveguide 37 includes a coaxial waveguide 37a having a circular cross section and extending upward from the opening 36 of the shield cover 34; and a horizontally extending rectangular waveguide 37b connected to an upper end of the coaxial waveguide 37a via a mode transducer 40. The mode transducer 40 disposed between the rectangular waveguide 37b and the coaxial waveguide 37a functions to convert a TE mode of a microwave propagated through the rectangular waveguide 37b into a TEM mode. Further, an internal conductor 41 extends in the coaxial waveguide 37a, and a lower end of the internal conductor 41 is fixedly connected to the center of the planar antenna member 31. With such configuration, the microwave is allowed to uniformly propagate to the planar antenna member 31 radially via the internal conductor 41.

Each component of the plasma processing apparatus 100 is connected to and controlled by a process controller 50 having a CPU. A user interface 51 is connected to the process controller 50, wherein the user interface 51 includes, e.g., a keyboard for a process manager to input a command to operate the plasma processing apparatus 100, a display for showing an operational status of the plasma processing apparatus 100, and the like.

Moreover, connected to the process controller 50 is a memory unit 52 for storing therein recipes including control programs (software), processing condition data, and the like to be used in realizing various processes, which are performed in the plasma processing apparatus 100 under the control of the process controller 50.

When receiving a command through the user interface 51, the process controller 50 retrieves and executes a necessary recipe from the memory unit 52, and a desired process is performed in the plasma processing apparatus 100 under the control of the process controller 50. The recipes including the control programs, the processing condition data, and the like can be stored in a computer readable storage medium such as a CD-ROM, a hard disk, a flexible disk, a flash memory, or the like. Alternatively, the recipes can be used online by being transmitted, when needed, from another apparatus via, e.g., a dedicated line.

Figure 3:
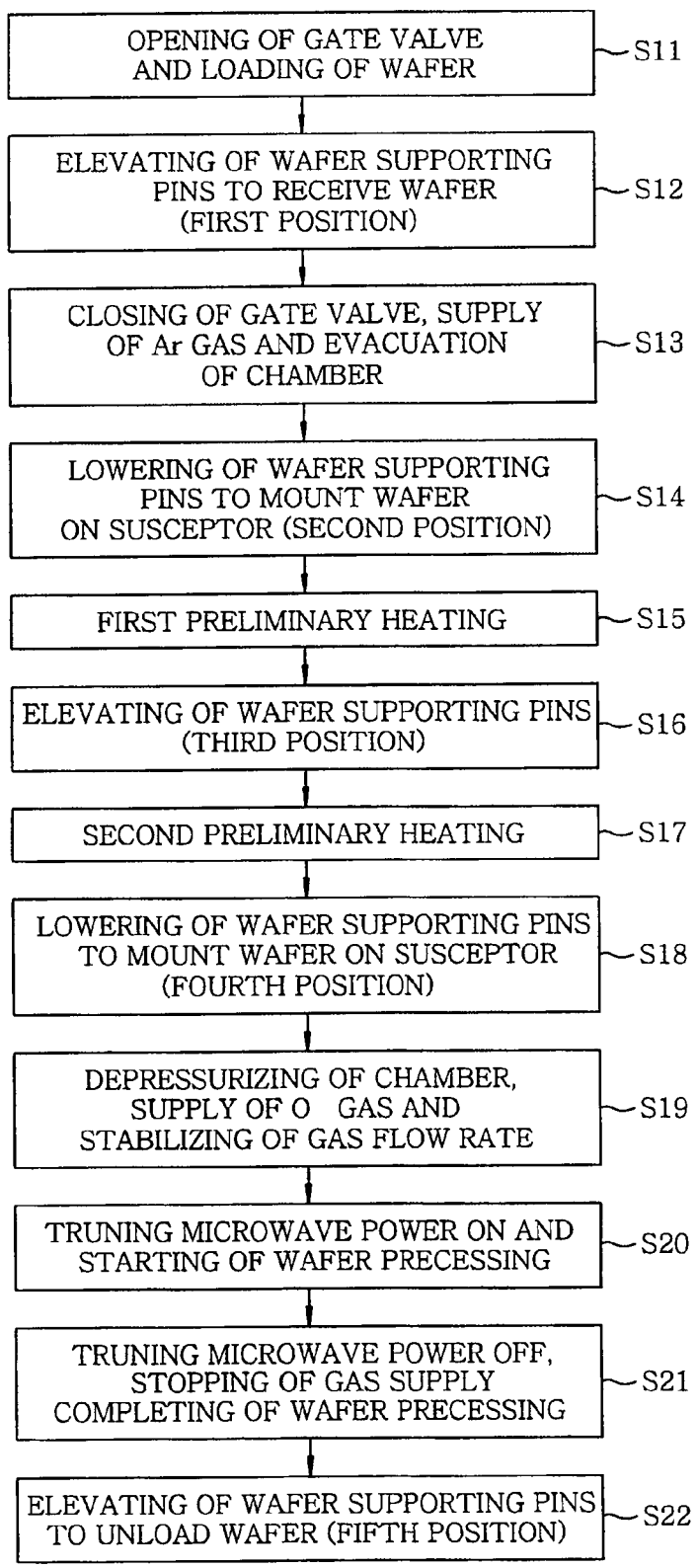
FIG. 3 sets forth a flowchart to describe an exemplary sequence of a plasma processing method in accordance with an embodiment of the present invention.

The RLSA plasma processing apparatus 100 configured as described above is capable of performing a process for forming a silicon oxide film by oxidizing silicon (polycrystalline or single crystalline silicon) of a wafer W. Below, the sequences of that process will be explained with reference FIGS. 3 to 5. FIG. 3 is a flowchart for schematically describing the plasma oxidation process; FIGS. 4A to 4D set forth schematic diagrams to show states inside the chamber 1 in major processes; and FIG. 5 presents a timing chart describing gas flow rates, a pressure, a microwave power and a position of the wafer supporting pins 60.

Figure 4A:
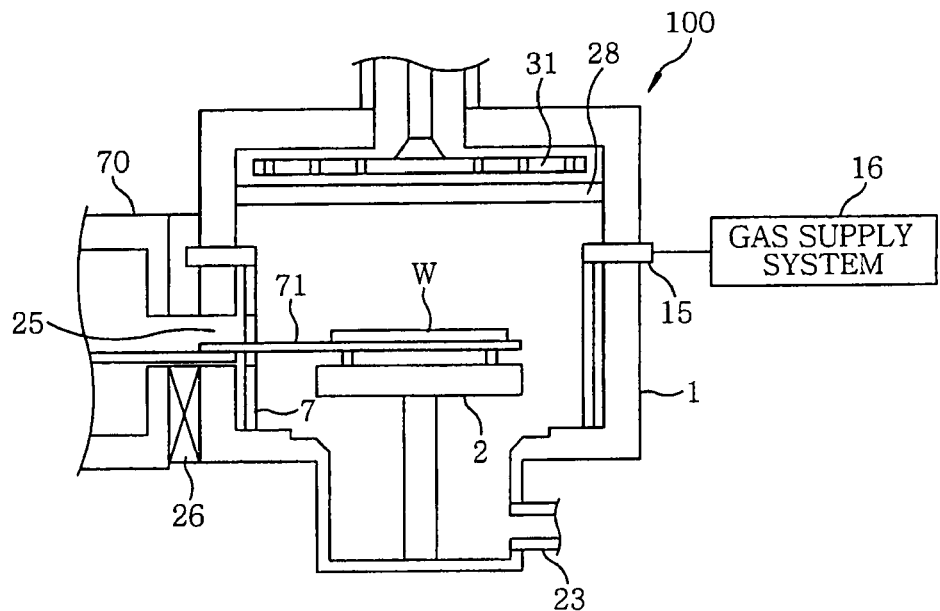
FIG. 4A is a schematic diagram showing a state in which a wafer is loaded into a chamber and supported by wafer supporting pins at a first position.

First, as shown in FIG. 4A, the gate valve 26 is opened, and a transfer mechanism 71 transfers a wafer W into the chamber 1 via the loading/unloading port 25 from a transfer chamber 70 which is maintained in a depressurized state (step S11). Then, the wafer supporting pins 60 are elevated to receive the wafer W at a first position (step S12).

Figure 4B:
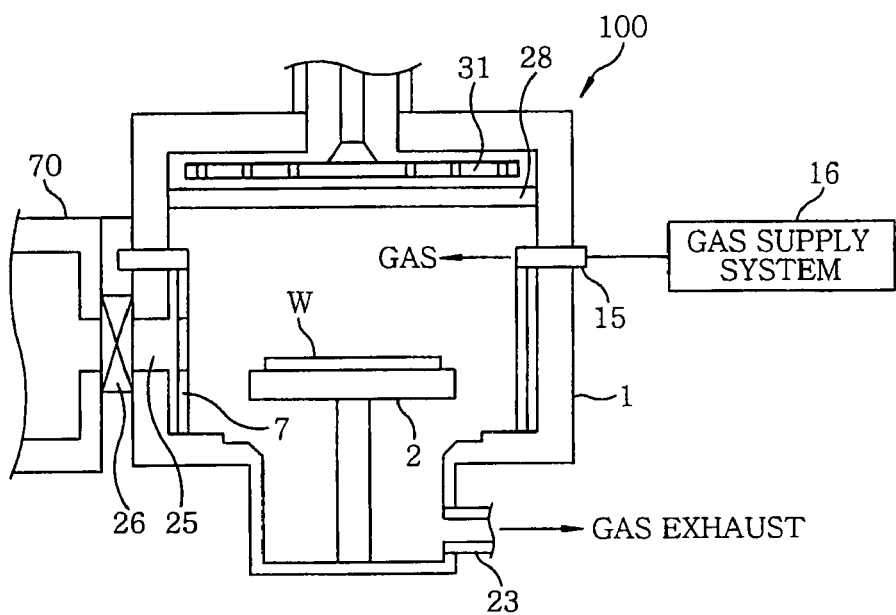
FIG. 4B presents a schematic diagram showing a state in which the wafer supporting pins are lowered and the wafer is being heated preliminarily at a second position.

Thereafter, the gate valve 26 is closed, and an Ar gas is supplied from the rare gas supply source 17 into the chamber 1 at a flow rate of, for example, about 1000 mL/min (sccm). At the same time, the chamber 1 is evacuated and maintained at a pressure level of, for example, about 126.6 Pa (950 mTorr) (step S13). Subsequently, as shown in FIG. 4B, the wafer supporting pins 60 are lowered so that the wafer W is placed on the susceptor 2, and this position is defined as a second position (step S14). This second position is a process position where the processing of the wafer W is carried out.

In this second position (i.e., in the state the wafer W is loaded on the susceptor 2), a first preliminary heating process is performed (step S15). The first preliminary heating process is carried out at a temperature level just before the wafer W is warped, i.e., in a temperature range where the warpage of the wafer w does not take place. As for a silicon wafer, for example, since the emissivity (thermal absorptivity) of the silicon wafer is maximized at 600° C. and its warpage is most likely to occur near this temperature level, the first preliminary heating is performed until the temperature of the wafer W reaches a level just before 600° C., for example, a temperature level less than 600° C. and, more specifically, less than 600° C. and higher than or equal to 400° C., and, preferably, in a range of 400° C. to 550° C. Since the emissivity is differentiated in case the wafer W has a film on it or when a substrate other than the silicon wafer is processed, an optimum heating temperature for the first preliminary heating can be determined by measuring the emissivity of the target substrate in advance. A processing time of the first preliminary heating process depends on the temperature of the susceptor 2, the kind of the substrate, the kind of the film thereon, and the like. For example, the processing time may be 5 to 30 seconds and, preferably, 15 to 25 seconds.

Since the first preliminary heating is performed while the wafer W is mounted on the susceptor 2, a temperature increasing rate of the wafer W is high due to a direct thermal transfer from the susceptor 2, so that the heating can be carried out for a short period of time. Accordingly, a throughput can be enhanced. Further, though the warpage of the wafer W is highly likely to take place in a temperature range where the emissivity of the wafer W is maximized, the first preliminary heating is a temperature increasing process in which the temperature of the wafer W is raised up to a temperature level just before such temperature range, so that the wafer W hardly warps in the first preliminary heating stage. Accordingly, it hardly occurs that the edge portion of the warped wafer W comes into contact with the susceptor 2, resulting in a damage of the wafer W or a particle contamination.

Figure 4C:
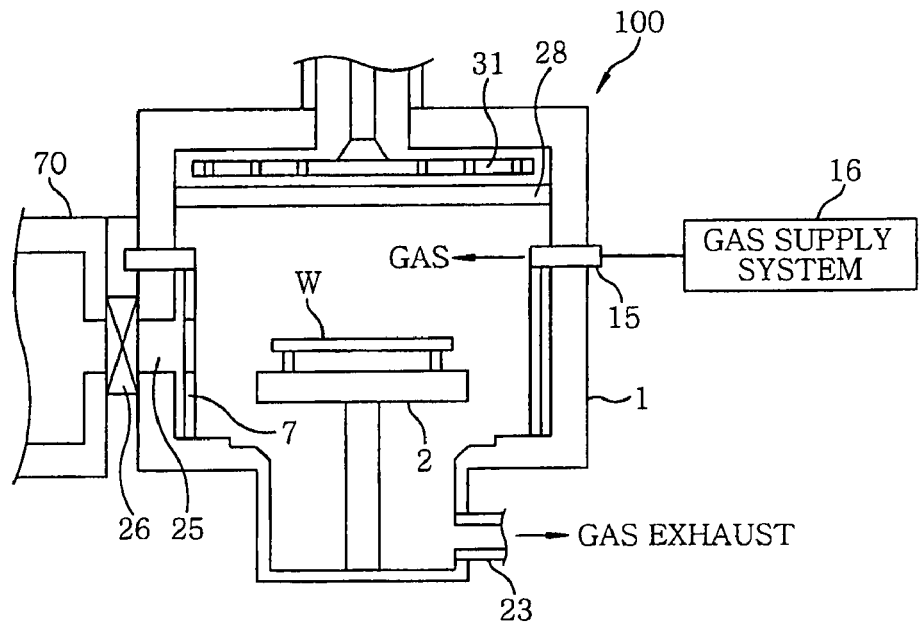
FIG. 4C depicts a schematic diagram showing a state in which the wafer supporting pins are raised and the wafer is being heated preliminarily at a third position.

Thereafter, as illustrated in FIG. 4C, the wafer supporting pins 60 are moved upward (step S16), and while maintaining the wafer W at a third position distanced apart from the susceptor 2, a second preliminary heating process is performed (step S17). Though the third position may be different from the first position where the wafer W is transferred between the transfer mechanism 71 and the supporting pins 60, it is preferable to set them to be the same positions. In the step S17, by keeping the wafer W at the transfer position until the wafer W reaches a processing temperature, it is possible to prevent an increase of a temperature difference between a center portion and an edge portion of the wafer W due to a rapid temperature rise of the wafer W. That is, while being maintained at the transfer position, the temperature of the wafer W can pass the temperature range in which the emissivity of the wafer W reaches its maximum level where the wafer W is most likely to be warped. Thus, even though the wafer W is warped, no more warpage takes place, and it is rather possible to straighten the warped wafer W during the second preliminary heating process. Further, even if the wafer W is warped during the second preliminary heating process, a contact between the edge portion of the wafer W and the susceptor 2 is prevented because the wafer W is supported on the supporting pins 60. As a result, an occurrence of such problems as a damage of the wafer, a particle contamination or a misalignment of the wafer W is prevented. The processing time of the second preliminary heating process depends on the temperature of the susceptor 2, the kind of the substrate, the kind of the film formed thereon, and the like. For example, the processing time of the second preliminary heating process may be about 10 to 120 seconds, and, more preferably, about 30 to 70 seconds.

Figure 4D:
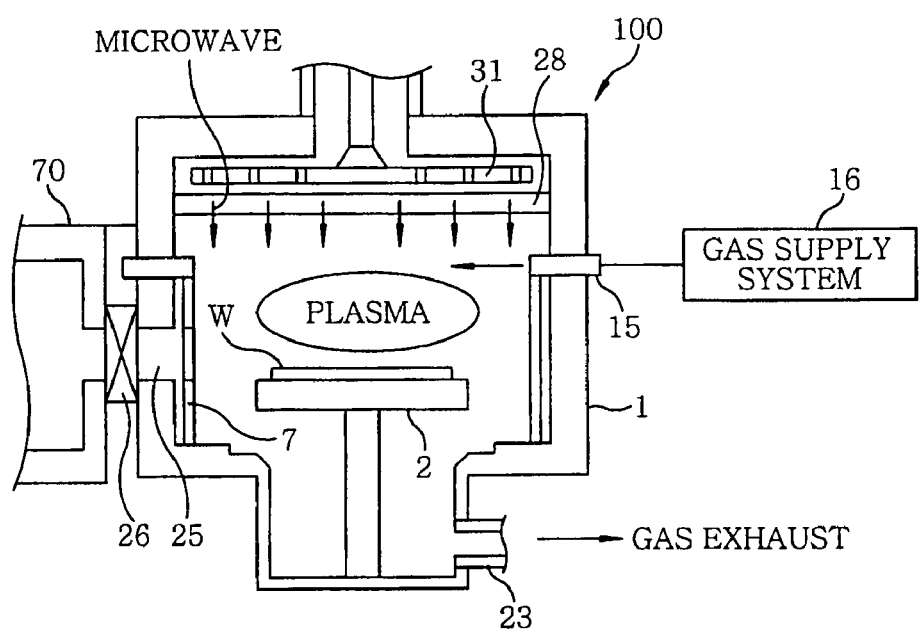
FIG. 4D provides a schematic diagram showing a state in which the wafer supporting pins are lowered and the wafer is being subjected to a plasma process.

Subsequently, the wafer supporting pins 60 are moved down, and, as shown in FIG. 4D, the wafer W is placed on the susceptor 2 again, and this position is defined as a fourth position (step S18). In this state, the chamber 1 is depressurized to about 106.6 Pa, and $O_2$ gas, for example, is introduced into the chamber 1 from the oxygen-containing gas supply source 18 of the gas supply system 16 via the gas introducing member 15 at a specific flow rate, and, thereafter, a stabilization of the gas flow rate is awaited (step S19). This gas stabilization process takes, for example, about 5 to 50 seconds and, preferably, 10 to 30 seconds.

Afterward, a microwave power is turned on so as to ignite a plasma, and wafer processing is started (step S20).

Specifically, the microwave from the microwave generating device 39 is transmitted to the waveguide 37 via the matching circuit 38 and then allowed to propagate through the rectangular waveguide 37b, the mode transducer 40 and the coaxial waveguide 37a in that order. Then, the microwave is supplied to the planar antenna member 31 via the internal conductor 41 and is then emitted to a space above the wafer W in the chamber 1 through the microwave radiation holes 32 of the planar antenna member 31 via the transmitting plate 28. The microwave propagates in the TE mode within the rectangular waveguide 37b. Then, the TE mode of the microwave is converted into the TEM mode by the mode transducer 40, and the microwave in the TEM mode propagates through the coaxial waveguide 37a toward the planar antenna member 31. Due to the microwave emitted from the planar antenna member 31 into the chamber 1 through the microwave transmitting plate 28, an electromagnetic field is generated in the chamber 1, whereby the Ar gas and the $O_2$ gas are converted into plasma. Specifically, the emission of the microwave through the plurality of microwave radiation holes 32 of the planar antenna member 31 causes the microwave plasma to have a high density of about $1\times10^{10}$ to $5\times10^{12}/cm^3$, and also to have a low electron temperature less than or equal to about 1.5 eV near the wafer W. The microwave plasma thus generated inflicts less plasma damage by ions or the like. Moreover, oxygen is introduced into the silicon by the action of active species in the plasma, especially by the action of oxygen radicals, so that a uniform $SiO_2$ film can be formed.

Furthermore, when performing a plasma nitriding process, a SiN film can be formed by using, for example, Ar and $N_2$ as a processing gas. In addition, by performing an oxynitriding process by using, for example, Ar, $N_2$ and $O_2$, a SiON film can be formed.

For the plasma oxidation process, the flow rate of the rare gas, for example, Ar, Xe, or the like, is set to be in the range of about 250 to 2000 mL/min (sccm); the flow rate of the oxygen-containing gas, for example, $O_2$ or the like, is set to be in the range of about 1 to 100 mL/min (sccm). Further, the internal pressure of the chamber is regulated at a processing pressure greater than 53.3 Pa and no greater than 101325 Pa (greater than 400 mTorr and no greater than 760 Torr), preferably, at a processing pressure in the range of about 80 Pa to 1333 Pa (600 mTorr to 10 Torr) and, more preferably, about 106.7 Pa to 400 Pa (800 mTorr to 3 Torr). Further, the wafer W is heated up to a processing temperature of about 700 to 1100° C., preferably, about 800 to 900° C. Though there is no limit in setting the processing time of the plasma oxidation process, the processing time may be set to be, for example, about 10 to 60 seconds, preferably, 20 to 40 seconds.

After the processing time of the plasma oxidation process elapses, the microwave power is turned off and the gas supply is stopped, and the whole process is ended (step S21). Thereafter, in the reverse sequence to the steps S11 and S12, the wafer supporting pins 60 are moved up to locate the wafer W at a fifth position, where the wafer W is unloaded from the chamber 1 by the transfer mechanism 71 (step S22).

In the present embodiment, since the temperature of the wafer W is raised substantially up to the processing temperature range in the second preliminary heating process, additional preliminary heating is not required after the wafer supporting pins 60 are lowered and the wafer W is mounted on the susceptor 2. However, in case the processing temperature is very high, for example, above 1000° C., it may be preferable to set up a third preliminary heating process.

Now, a result of investigating effects of the present invention will be explained. By using the plasma processing apparatus 100, a wafer W is processed under processing conditions as specified in Tables 1 to 3, and warpage of the wafer W and particle generation were investigated. In all conditions, the processing temperature (the temperature of the wafer W being processed) was set to be 800° C.

Table 1 (comparative method 1) shows an example which takes no measures to cope with the warpage of a wafer W. Specifically, as shown in Table 1, after locating the wafer W at the process position by lowering the wafer supporting pins 60, a preliminary heating process was performed for 60 seconds, and 20 seconds elapsed to stabilize a gas. Then, a plasma oxidation process was performed for 30 seconds, and a plasma end process (Process No. 4) was conducted for 3 seconds. A set temperature of the heater 5 of the susceptor 2 was 80° C. through the whole process. Table 2 (comparative method 2) shows an example in which, as a means to cope with the warpage of a wafer W, a first preliminary heating process was performed for 120 seconds while maintaining the wafer W at the transfer position by raising the wafer supporting pins 60 after the wafer W was loaded into the chamber 1 and, then, a second preliminary heating process was performed for 60 seconds while locating the wafer W at the transfer position on the susceptor 2. After the completion of the second preliminary heating process, 20 seconds elapsed to stabilize a gas while keeping the wafer W at the process position, and, then, a plasma oxidation process was performed at the process position for 30 seconds. Thereafter, a plasma end process (Process No. 5) was conducted for 3 seconds. A set temperature of the heater 5 of the susceptor 2 was 800° C. through the whole process.

Table 3 (method of the present invention) shows an example in which, as a means to cope with the warpage of a wafer W, a first preliminary heating process was performed for 20 seconds while maintaining the wafer W at the process position by lowering the wafer supporting pins 60, and, then, a second preliminary heating process was performed for 70 seconds while locating the wafer W at the transfer position by raising the wafer supporting pins 60. After the completion of the second preliminary heating process, 20 seconds elapsed to stabilize a gas while keeping the wafer W at the process position, and, then, a plasma oxidation process was performed at the process position for 30 seconds. Further, a plasma end process (Process No. 5) was conducted for 3 seconds. A set temperature of the heater 5 of the susceptor 2 was set to be 800° C. through the whole process except for the first preliminary heating process where the temperature of the heater 5 was set to be less than 600° C.

Further, the positions of the wafer supporting pins 60 corresponding to the processes of the tables 1 to 3 were described in FIG. 6.

TABLE 1

| Process No. | 1 | 2 | 3 | 4 |
|---|---|---|---|---|
| Content | Preliminary heating | Gas stabilization | Plasma On (Oxidation) | Plasma Off |
| Time (sec) | 60 | 20 | 30 | 3 |
| Position of wafer supporting pins | Process position | Process position | Process position | Process position |
| Pressure (Pa) | 126.6 | 106.6 | 106.6 | 106.6 |
| Ar flow rate (mL/min) | 1000 | 1000 | 1000 | 1000 |
| $O_2$ flow rate (mL/min) | 0 | 5 | 5 | 5 |
| Microwave power (W) | 0 | 0 | 900 | 0 |
| Temperature (° C.) | 800 | 800 | 800 | 800 |

TABLE 2

| Process No. | 1 | 2 | 3 | 4 | 5 |
|---|---|---|---|---|---|
| Content | Preliminary heating | Preliminary heating | Gas stabilization | Plasma on (oxidation) | Plasma off |
| Time (sec) | 120 | 60 | 20 | 30 | 3 |
| Position of wafer supporting pins | Transfer position | Process position | Process position | Process Position | Process position |
| Pressure (Pa) | 126.6 | 126.6 | 106.6 | 106.6 | 106.6 |
| Ar flow rate (mL/min) | 1000 | 1000 | 1000 | 1000 | 1000 |
| $O_2$ flow rate (mL/min) | 0 | 0 | 5 | 5 | 5 |
| Microwave power (W) | 0 | 0 | 0 | 900 | 0 |
| Temperature (° C.) | 800 | 800 | 800 | 800 | 800 |

TABLE 3

| Process No. | 1 | 2 | 3 | 4 | 5 |
|---|---|---|---|---|---|
| Content | First preliminary heating | Second preliminary heating | Gas stabilization | Plasma on (oxidation) | Plasma off |
| Time (sec) | 20 | 70 | 20 | 30 | 3 |
| Position of wafer supporting pins | Process position | Transfer position | Process position | Process Position | Process position |
| Pressure (Pa) | 126.6 | 126.6 | 106.6 | 106.6 | 106.6 |
| Ar flow rate (mL/min) | 1000 | 1000 | 1000 | 1000 | 1000 |
| $O_2$ flow rate (mL/min) | 0 | 0 | 5 | 5 | 5 |
| Microwave power (W) | 0 | 0 | 0 | 900 | 0 |
| Temperature (° C.) | Lower than 600 | 800 | 800 | 800 | 800 |

In the comparative method 1 described in Table 1, the wafer W was severely warped from about 30 seconds after the preliminary heating was begun. Further, as reveled from an inspection result by a foreign material inspection apparatus (Surpscan), a particle-clustered region was generated on the wafer W.

In the comparative method 2 described in Table 2, after being loaded, the wafer W was disposed at the transfer position and the first preliminary heating was performed in this state. Then, after the temperature of the wafer W passed a temperature increasing range where warpage of the wafer W takes place, the wafer W was mounted on the susceptor 2 and the second preliminary heating was carried out in this state. Here, since the warpage of the wafer W took place at 80 to 120 seconds after the beginning of the preliminary heating, it is required to set the processing time of the preliminary heating process to be no smaller than 120 seconds. In this comparative method 2, warpage of the wafer W does not occur and no particle was found, either. However, since it takes a long time of 120 seconds to perform the first preliminary heating which is carried out in the state where wafer W was located at the transfer position, the total time period from the start of the first preliminary heating to the end of the wafer processing amounted to as much as 230 seconds, whereby a throughput deteriorates (see FIG. 6).

In the method of the present invention described in Table 3, after the wafer W was loaded into the chamber 1, the first preliminary heating was performed for 20 seconds in the state the wafer W was mounted on the susceptor 2. After the temperature increased rapidly up to a temperature level just before the warpage of the wafer W takes place, the process was switched to the second preliminary heating, which was performed in the state that the wafer W is sustained at the transfer position. Accordingly, the warpage of the wafer W could be prevented securely, and no particle was found. Furthermore, as shown in FIG. 6, the total time period from the start of the first preliminary heating to the end of the wafer processing amounted to 140 seconds, so that a throughput improved greatly in comparison with that of the comparative method 2.

It is known that the emissivity of a wafer W (silicon substrate) reaches its maximum level at about 600° C. or thereabout. Accordingly, during a process of increasing the temperature of the wafer W, a temperature range around 600° C. is deemed to be where the warpage of the wafer W is most likely to occur. Thus, since the temperature of the wafer W increases fast in the state that the wafer W is mounted on the susceptor 2 as in the comparative method 1, the wafer W would be warped in a temperature range around 600° C. at this temperature increasing rate, thereby contacting the susceptor 2 and causing a particle generation. It is because there was generated a temperature difference between a wafer surface on the side of the heater (susceptor 2) and a wafer surface on a vacuum side (a top surface of the wafer W).

Meanwhile, in the comparative method 2 for performing the first preliminary heating while locating the wafer W at the transfer position, the wafer W does not receive heat from the susceptor 2 directly, so that its temperature rises slowly and it does not suffer a rapid temperature variation. Therefore, warpage of the wafer W does not take place readily. Moreover, if the wafer W is sustained on the wafer supporting pins 60 such that a sufficient distance may be kept between the wafer W and the susceptor 2, the temperature of the wafer W passes the temperature range around 600° C. via a heat transfer space. Therefore, even when the wafer W is warped (distorted), its contact with the susceptor 2 can be avoided. Furthermore, by keeping on increasing the temperature of the wafer W up to a temperature level (processing temperature) above 600° C. at the transfer position, the wafer W can be straightened even if it was warped. After the wafer W is straightened, the wafer W is mounted on the susceptor 2, and the wafer W is heated up to the processing temperature over, e.g., 700° C. Even in case a plasma process is performed at this temperature level, warpage of the wafer W does not occur, so that a particle contamination can be prevented. However, in this comparative method 2, since the wafer W needs to be heated up to the temperature level above 600° C. while it is held on the wafer supporting pins 60, it takes as much as 120 seconds for the heating of the wafer W, resulting in a great reduction of throughput.

Meanwhile, in the present method, the wafer W is placed at the transfer position and is rapidly heated by a direct heat transfer from the susceptor 2 up to a temperature level just before 600° C. where its emissivity reaches its maximum level in the initial stage of the preliminary hearting. Thereafter, by elevating the wafer supporting pins 60, the temperature of the wafer W passes the temperature range around 600° C. while the wafer W is maintained at the transfer position. Thus, a contact between the wafer W and the susceptor 2 can be prevented even in case the wafer w is warped. Further, by increasing the wafer temperature up to the processing temperature in such state, the wafer once warped can be straightened. Moreover, by performing the first preliminary heating while keeping the wafer W located on the susceptor 2, the temperature of the wafer W can increase rapidly to near 600° C. Accordingly, the present method provides a solution to the warpage of the wafer W, while achieving a high throughput as well.

Figure 7:
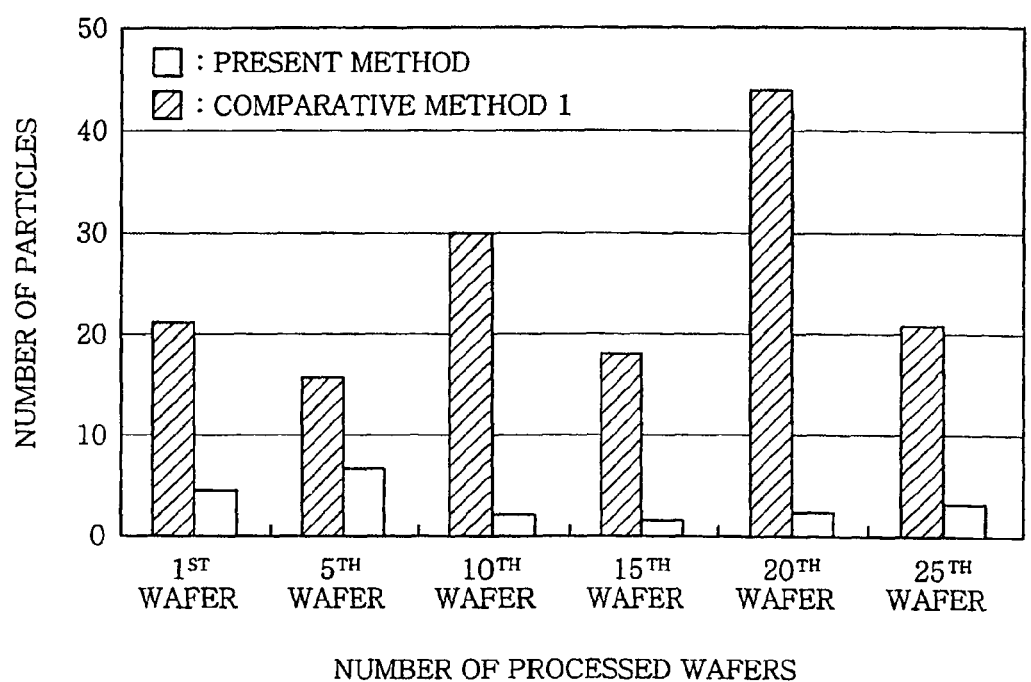
FIG. 7 presents a graph showing a measurement result of the number of particles when wafers are processed successively.

FIG. 7 is a graph showing the number of particles in two cases of processing a wafer W with the plasma processing apparatus 100 in accordance with the comparative method 1 in Table 1 and the present method in Table 3. Here, wafers W are processed at the 1$^{st}$, the 5$^{th}$, the 10$^{th}$, the 15$^{th}$, the 20$^{th}$ and the 25$^{th}$ processing, while dummy wafers are processed at the 2$^{nd}$ to 4$^{th}$, the 6$^{th}$ to 9$^{th}$, the 11$^{th}$ to 14$^{th}$, the 16$^{th}$ to 19$^{th}$ and the 21$^{th}$ to 24$^{th}$ processing. A vertical axis of FIG. 7 denotes the number of particles present on the surface of the wafer W.

As revealed from FIG. 7, as many as 16 or more particles were detected in the comparative method 1, whereas as small as 10 or less particles were detected in the present method. This seems because the wafer W warps in the comparative method 1 due to rapid heating of the wafer W and the warped wafer W contacts the suscpetor 2, resulting in the particle generation.

Then, an influence of a pressure upon the warpage of the wafer W and straightening of the warped wafer W (elimination of the warpage) thereafter was investigated for the case of performing a plasma oxidation process by using the plasma processing apparatus 100 in accordance with the method of the present invention.

Under processing conditions specified in Table 4, a substrate processing was carried out while varying a pressure in the range from 40 Pa to 126.6 Pa. In each of process stages (process Nos. 1 to 5), an occurrence of a warpage deformation of a substrate, a time period taken before the substrate is warped, a time taken before the warped substrate is straightened (that is, the warpage deformation was eliminated) were observed with naked eyes, and the results are provided in Table 5. In Table 5, "O" represents a state where the warpage of the substrate does not occur (including a state the substrate once warped is straightened back), and "X" represents a state where the warpage of the substrate takes place. A set temperature of the heater 5 of the susceptor was set to be 800° C. in all processes except for the first preliminary process where the set temperature was less than 600° C.

TABLE 4

| Process No. | 1 | 2 | 3 | 4 | 5 |
|---|---|---|---|---|---|
| Content | First preliminary heating | Second preliminary heating | Gas stabilization | Plasma on (oxidation) | Plasma off |
| Time (sec) | 20 | 70 | 20 | 5 | 3 |
| Position of wafer supporting pins | Process position | Transfer position | Process position | Process Position | Process position |
| Pressure (Pa) | Varied in the range from 40 Pa to 126.6 Pa, as described in FIG. 5 | | | | |
| Ar flow rate (mL/min) | 1500 | 1500 | 1500 | 1500 | 1500 |
| O$_2$ flow rate (mL/min) | 0 | 0 | 5 | 5 | 5 |
| Microwave power (W) | 0 | 0 | 0 | 1200 | 0 |
| Temperature (° C.) | Lower than 600 | 800 | 800 | 800 | 800 |

TABLE 5

| Sample No. | Chamber internal pressure | Process No. | | | | |
|---|---|---|---|---|---|---|
| | | 1 | 2 | 3 | 4 | 5 |
| 1 | 40 Pa [0.3 Torr] | O | Warped at 40 sec, not straightened for the next 30 seconds | X | X | X |
| 2 | 40 Pa [0.3 Torr] | O | Warped at 45 sec, not straightened for the next 25 seconds | X | X | X |
| 3 | 40 Pa [0.3 Torr] | O | Warped at 45 sec, not straightened for the next 25 seconds | X | X | X |
| 4 | 40 Pa [0.3 Torr] | O | Warped at 45 sec, not straightened for the next 25 seconds | X | X | X |
| 5 | 40 Pa [0.3 Torr] | O | Warped at 45 sec, not straightened for the next 25 seconds | X | X | X |
| 6 | 53.3 Pa [0.4 Torr] | O | Warped at 45 sec, not straightened for the next 30 seconds | X | X | X |
| 7 | 106.6 Pa [0.8 Torr] | O | Warped at 30 sec, straightened within the next 35 seconds | O | O | O |
| 8 | 126.6 Pa [0.95 Torr] | O | Warped at 30 sec, straightened for the next 30 seconds | O | O | O |
| 9 | 40 Pa [0.3 Torr] | O | Warped at 45 sec, not straightened for the next 25 | X | X | X |

TABLE 5-continued

| Sample No. | Chamber internal pressure | Process No. 1 | 2 | 3 | 4 | 5 |
|---|---|---|---|---|---|---|
| 10 | 53.3 Pa [0.4 Torr] | ○ | Warped at 40 sec, not straightened for the next 30 seconds | X | X | X |
| 11 | 80 Pa [0.6 Torr] | ○ | Warped at 40 sec, straightened within the next 25 seconds | ○ | ○ | ○ |
| 12 | 106.6 Pa [0.8 Torr] | ○ | Warped at 35 sec, straightened within the next 30 seconds | ○ | ○ | ○ |
| 13 | 126.6 Pa [0.95 Torr] | ○ | Warped at 30 sec, straightened for the next 30 seconds | ○ | ○ | ○ |

As can be seen from Table 5, in the process No. 2 (second preliminary heating process performed at the transfer position), all samples of the wafers W were warped. However, in case of the samples under high pressure conditions, for example, sample Nos. 7, 8, and 11 to 13, the time taken until the occurrence of the warpage after the start of the process was short, ranging from, for example, 30 to 40 seconds. Thus, during the rest of the processing time of 70 seconds for the process No. 2 (that is, for the last 20 to 30 seconds of the process No. 2), the wafers W once warped could be straightened. Further, during the subsequence processes (process Nos. 3 to 5), no warpage took place again.

As described, by setting the processing pressure to be no smaller than 80 Pa, warpage of the wafer W may take place in a short period of time and the wafer once warped can be straightened rapidly during the second preliminary heating process which is performed at the transfer position. That is, by means of setting the processing pressure to be high slightly, the warpage of the wafer W is made to take place in an early stage of the second preliminary heating process and, also, the warped wafer W can be straightened fast. Thus, it is possible to complete the straitening of the warped wafer W while the wafer W is maintained at the transfer position (within the second preliminary heating process).

In contrast, under low pressure conditions in which the chamber internal pressure was no greater than 53.3 Pa, a comparatively longer time of at least 40 seconds was taken before the warpage took place in the preliminary heating process of the process No. 2. Besides, the warpage deformation was not eliminated during the process No. 2 of 70 seconds, and the warped wafer W mounted on the susceptor 2 was not straightened during the subsequent processes Nos. 3 to 5, either. Moreover, since the warped wafer W was mounted on the susceptor 2 when the process proceeded to the process No. 3, there was a likelihood that the wafer W would bounce on the susceptor 2.

From the above results, by mounting the substrate on the susceptor 2 and increasing the temperature of the wafer W rapidly up to a level less than 600° C., for example, 550° C. in the first preliminary heating process (process No. 1) and, by heating the wafer W indirectly via the gas/vacuum region without directly transferring heat to the wafer W by means of elevating the wafer position pins 60 in the second preliminary heating process (process No. 2) for increasing the temperature equal to or higher than 600° C. up to the processing temperature, the warpage of the wafer W can be prevented.

Moreover, it was proved that as the processing pressure for the second preliminary heating process was set higher, the warpage deformation of the wafer W can be securely eliminated. Though heat is transferred to the wafer W on the wafer supporting pins 60 via the gas, a partial pressure of the gas increases and a greater amount of gas molecules exist around the wafer if the pressure is high. As a result, when the pressure is higher, the thermal conductivity to the wafer W held on the wafer supporting pins 60 is higher and a time period from the occurrence of the warpage till the recovering of the warpage shortens, whereby the wafer W is prevented from being left warped. In view of the foregoing, it is preferable to set the processing process of the second preliminary heating process to be higher than that of the first preliminary heating process.

Furthermore, by utilizing the influence of the pressure factor, it is possible to perform the second preliminary heating process at a pressure of 80 Pa or greater in the event that, for example, the occurrence of warpage cannot be avoided. As a result, both the warpage of the wafer W and elimination of the warpage deformation are completed within the second preliminary heating process, so that the wafer W can be prevented from being left warped.

In view of the forgoing, it is preferable to set the internal pressure of the chamber 1 to be greater than about 53.3 Pa and equal to or smaller than about 1333 Pa (400 mTorr to 10 Torr), and, more preferably, no smaller than about 80 Pa (600 mTorr), and still more preferably, to be in the range from about 106.6 to 400 Pa (800 mTorr to 3 Torr). Further, the pressure for the second preliminary heating process may be identical to or different from a pressure for a plasma process (process No. 4).

Moreover, the flow rate of a nonreactive gas is preferably higher than or equal to about 500 mL/min and, more preferably, higher than or equal to about 1000 mL/min.

Though the present invention has been described with respect to the embodiment, it is to be noted that the present invention is not limited thereto but various modifications may be made. That is, the embodiment is for clarifying the technical conception of the present invention, without limiting the present invention thereto. Thus, various modifications may be made without departing from the spirit and scope of the present invention.

For example, though the RLSA plasma processing apparatus 100 is employed in the above-described embodiment, the present invention method can be also be applied to other plasma processing apparatuses of various types such as, for example, a remote plasma type, an ICP plasma type, an ECR plasma type, a surface reflective wave plasma type, a magnetron plasma type, and so forth.

Figure 8:
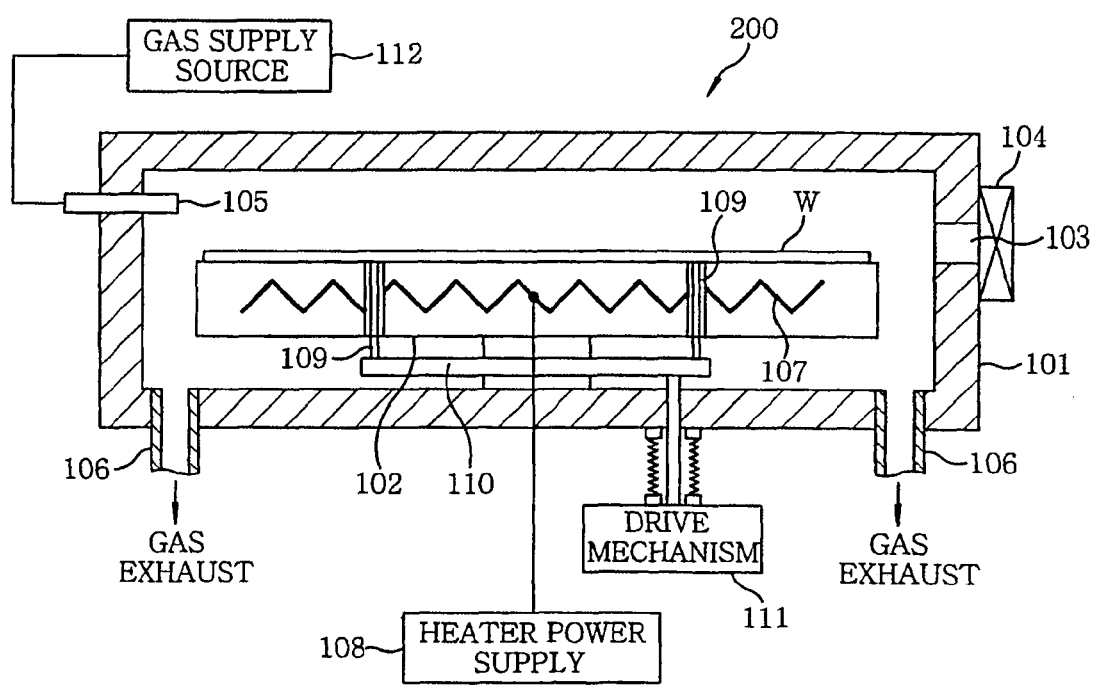
FIG. 8 is a schematic cross sectional view of an exemplary heat treatment device to which the present invention is applicable.

Furthermore, though the embodiment has been described for the case of performing an oxidation process to a semiconductor wafer which is a target substrate to be processed, the type of process is not limited thereto. For example, the present invention can also be applied to, for example, a nitriding process; a film forming process for forming a film on the substrate at a temperature of about 700° C. or higher; a heat treatment process for heating the substrate by using a RTP (Rapid Thermal Processor) or the like; a deposition process for depositing a silicon oxide film, a metal film or the like by CVD, and the like For example, FIG. 8 is a schematic cross sectional view showing a configuration example of a heat treating apparatus 200 capable of performing the method of the present invention. The heat treating apparatus 200 includes a circular plate shaped susceptor 102 disposed in a chamber 101 made of, for example, aluminum, wherein the susceptor 102 serves to mount thereon a wafer W to be processed. A loading/unloading port 103 through which the wafer W is loaded into or unloaded from the chamber 101 is provided at a sidewall of the chamber 101, and the loading/unloading port 103 is opened or closed by a gate valve 104. Further, also provided at a sidewall of the chamber 101 is a gas nozzle 105 for supplying a processing gas, for example, $N_2$, for use in a heat treatment. The gas nozzle 105 supplies the processing gas from a gas supply source 112 into the chamber 101 at a preset flow rate. Further, a gas exhaust line 106 is connected to a lower part of the chamber 10, and a processing space is evacuated to a vacuum by a gas exhaust unit (not shown) via the gas exhaust line 106.

The susceptor 102 includes a resistance heater 107 which functions to heat the wafer W mounted on the susceptor 2 up to 700° C. or greater by a power supplied from a heater power supply 108. Further, three wafer supporting pins 109 (only two of them are shown) are installed in the susceptor 102 to support the wafer W, wherein the wafer supporting pins 109 are configured to be protrusible above and retractable below the surface of the susceptor 102. The wafer supporting pins 60 are supported by a drive mechanism 111 such as an air cylinder via a supporting plate 110 in a manner than they are movable up and down. In the heat treating apparatus 200 having this configuration, it is also possible to change a height position of the wafer W between a transfer position and a process position on the susceptor by means of elevating the wafer supporting pins 109. Accordingly, a first preliminary heating process and a second preliminary heating process can be performed on the wafer W at different positions under the control of a controller (not shown).

Figure 9:
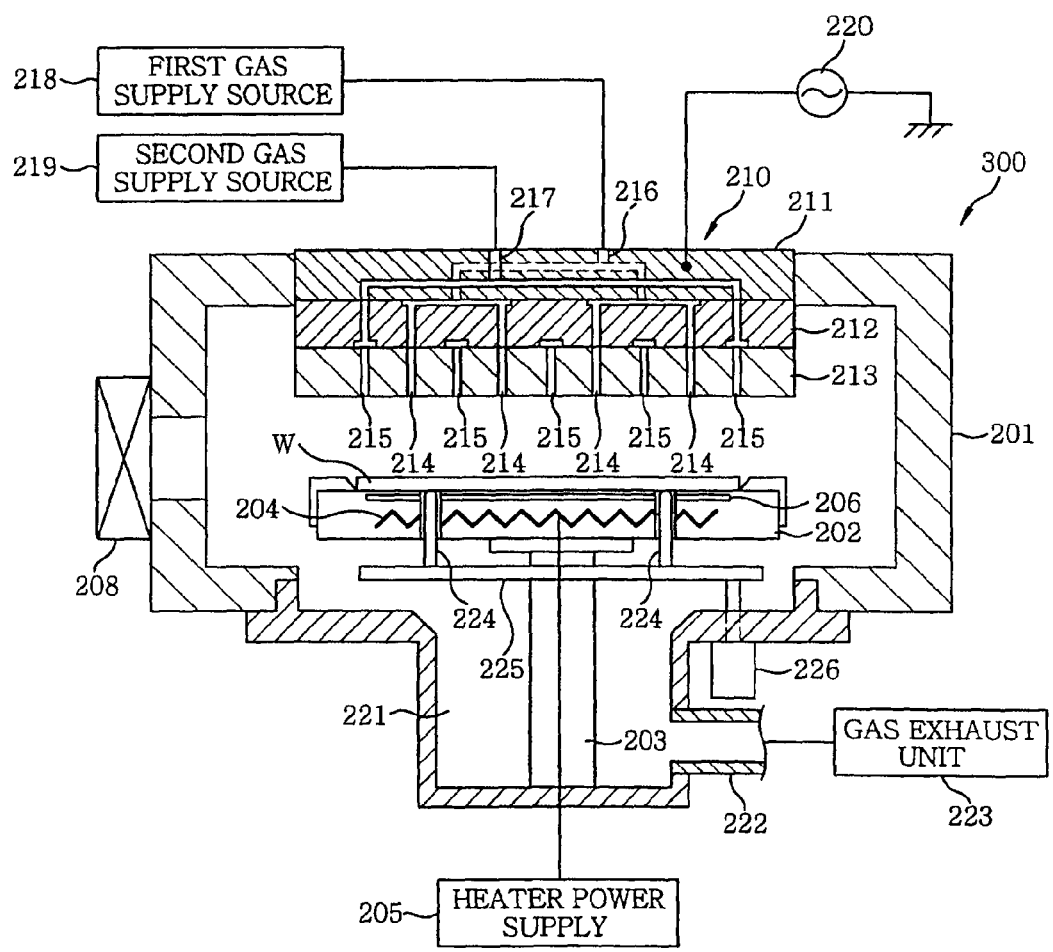
FIG. 9 sets forth a schematic cross sectional view of an exemplary CVD apparatus to which the present invention is applicable.

FIG. 9 sets forth a cross sectional view showing a configuration example of a plasma CVD apparatus 300 capable of performing the method of the present invention. The plasma CVD apparatus includes a chamber 201, and a susceptor 202 for horizontally supporting thereon a wafer W to be processed is disposed in the chamber 201 by being supported on a cylindrical supporting member 203 which is provided at a central bottom portion of the chamber 201. The susceptor 202 is made of ceramics such as AlN, and a resistance heater 204 is embedded in the susceptor 202. The resistance heater 204 heats the wafer W up to a specific temperature level by a power supplied from a heater power supply 205. Furthermore, the susceptor 202 also incorporates therein an electrode 206 serving as a lower electrode, which is disposed on the resistance heater 204.

A loading/unloading port 207 through which the wafer W is loaded into or unloaded from the chamber 201 and a gate valve 208 which opens or closes the loading/unloading port 207 are provided at a sidewall of the chamber 201. A shower head 210 is disposed at a ceiling wall of the chamber 201. The shower head 210 includes an upper block body 211, an intermediate block body 212 and a lower block body 213. Gas discharge openings 214 and gas discharge openings 215 are formed through the lower block body 213 alternately and are connected to a first gas supply unit 218 and a second gas supply unit 219 via a first gas inlet 216 and a second gas inlet 217, respectively. The first gas supply unit 218 includes gas sources (not shown) of, for example, $TiCl_4$ gas as a Ti-containing gas, Ar gas as a plasma gas, and the like, and the second gas supply unit 219 includes gas sources (not shown) of, for example, $H_2$ gas as a reduction gas, $NH_3$ gas or $N_2$ as a nitrifying gas, $O_2$ gas as an oxidizing gas, and the like.

A high frequency power supply 220 is connected to the shower head 210 to supply a high frequency power to the shower head when a film formation is performed. By the supply of the high frequency power from the high frequency power supply 220, a high frequency electric field is generated between the shower head 210 and the electrode 206, whereby a gas supplied into the chamber 201 can be converted into a plasma, and a Ti film can be formed. Disposed under the chamber 201 is a gas exhaust chamber 221, and a gas exhaust line 222 is connected to a sidewall surface of the gas exhaust chamber 221. A gas exhaust unit 223 is coupled to the gas exhaust line 222. By operating the gas exhaust unit 223, the chamber 201 can be depressurized to a preset vacuum level. Three wafer supporting pins 224 (only two of them are shown) are installed in the susceptor 202 to move the wafer W up and down while supporting it, wherein the wafer supporting pins 224 are configured to be protrusible above and retractable below the surface of the susceptor 102. The wafer supporting pins 224 are supported on a supporting plate 225. The wafer supporting pins 224 are moved up and down by a drive mechanism 226 such as an air cylinder via the supporting plate 225, to thereby raise or lower the position of the wafer W.

In the CVD apparatus 300 having the above-described configuration, it is also possible to change a height position of the wafer W between a transfer position and a process position on the susceptor 2 by means of elevating the wafer supporting pins 224. Accordingly, a first preliminary heating process and a second preliminary heating process can be performed on the wafer W at different positions under the control of a controller (not shown).

The technical conception of the present invention can also be applied to a case where the target substrate is, for example, a glass substrate for a flat panel display (FPD) represented by a liquid crystal display (LCD), a compound semiconductor wafer, or the like.

INDUSTRIAL APPLICABILITY

The present invention can be appropriately applied to a process involving a heat treatment in the course of manufacturing various semiconductor apparatuses.

What is claimed is:

1. A substrate processing method comprising:
    loading a target substrate into a processing chamber and receiving the target substrate on substrate supporting pins at a first position determined by elevating the substrate supporting pins;
    after said receiving the target substrate on substrate supporting pins, performing a series of heating steps on the target substrate including,
    lowering the substrate supporting pins and performing a first preliminary heating process on the target substrate mounted at a second position on a mounting table,
    elevating the substrate supporting pins to separate the target substrate from the mounting table, and
    performing a second preliminary heating process on the target substrate while maintaining the target substrate at a third position on the elevated substrate supporting pins; and
    after said series of heating steps, processing the target substrate at a fourth position on the mounting table while heating the substrate at a processing temperature of about 700° C. or higher after lowering the substrate supporting pins to mount the target substrate on the mounting table.

2. The substrate processing method of claim 1, wherein the target substrate is a silicon substrate, and a heating temperature of the first preliminary heating process is lower than about 600° C.

3. The substrate processing method of claim 1, wherein the processing temperature ranges from about 700° C. to 1100° C.

4. The substrate processing method of claim 1, wherein a processing pressure of the processing chamber in the second preliminary heating process is higher than about 53.3 Pa and lower than or equal to about 1333 Pa.

5. The substrate processing method of claim 1, wherein the temperature of the target substrate is increased under a first pressure condition in the first preliminary heating process, while the temperature of the target substrate is increased under a second pressure condition in the second preliminary heating process, the first pressure condition being lower than the second pressure condition.

6. The substrate processing method of claim 1, wherein the temperature of the target substrate is increased under a same processing condition both in the first preliminary heating process and in the second preliminary heating process.

7. The substrate processing method of claim 1, wherein the second preliminary heating process includes:
  warping the target substrate by heating the target substrate for a preset time period; and
  straightening the warped target substrate by heating the target substrate for a predetermined time period.

8. The substrate processing method of claim 1, wherein the substrate processing apparatus is a plasma processing apparatus which processes the target substrate by making a plasma of a processing gas act on the target substrate.

9. The substrate processing method of claim 8, wherein the plasma is generated by introducing a microwave into the processing chamber through a planar antenna having a number of slots.

10. The substrate processing method of claim 1, wherein the target substrate is heated up to a first temperature in the first preliminary heating process and is heated up to a second temperature in the second preliminary heating process, the first temperature being lower than the second temperature.

11. The substrate processing method of claim 10, wherein the first temperature is lower than about 600° C.

12. The substrate processing method of claim 10, wherein the second temperature is equal to or higher than about 600° C.

13. A substrate processing method comprising:
  loading a target substrate into a processing chamber and receiving the target substrate on substrate supporting pins at a first position determined by elevating the substrate supporting pins;
  after said receiving the target substrate on substrate supporting pins, performing a series of heating steps on the target substrate including,
  lowering the substrate supporting pins and performing a first preliminary heating process on the target substrate mounted at a second position on a mounting table for a preset time period within a temperature range in which a warpage of the substrate does not take place, and
  elevating the substrate supporting pins to separate the target substrate from the mounting table and performing a second preliminary heating process on the target substrate while maintaining the target substrate at a third position on the elevated substrate supporting pins within a temperature range in which the target substrate is likely to warp; and
  after said series of heating steps, processing the target substrate at a fourth position on the mounting table while heating the substrate at a processing temperature of about 700° C. or higher after lowering the substrate supporting pins to mount the target substrate on the mounting table.

14. The substrate processing method of claim 13, wherein the target substrate is a silicon substrate, and a heating temperature in the first preliminary heating process is lower than about 600° C.

15. A plasma processing apparatus comprising:
  a vacuum-evacuable processing chamber for processing a target substrate;
  a gas introducing member for supplying a processing gas into the processing chamber;
  a mounting table for mounting thereon the target substrate;
  a heater embedded in the mounting table for heating the target substrate;
  substrate supporting pins protrusible above and retractable below a mounting surface of the mounting table, for supporting the target substrate thereon when the substrate supporting pins elevate above the mounting surface; and
  a control unit for controlling substrate processing and said control unit programmed with instructions to execute:
  loading the target substrate into the processing chamber and receiving the target substrate on the substrate supporting pins at a first position determined by elevating the substrate supporting pins;
  after said receiving the target substrate on substrate supporting pins, performing a series of heating steps on the target substrate including,
  lowering the substrate supporting pins and performing a first preliminary heating process on the target substrate mounted at a second position on the mounting table, and
  elevating the substrate supporting pins to separate the target substrate from the mounting table and performing a second preliminary heating process on the target substrate while maintaining the target substrate at a third position on the elevated substrate supporting pins; and
  after said series of the heating steps, processing the target substrate at a fourth position on the mounting table while heating the substrate at a processing temperature of about 700° C. or higher after lowering the substrate supporting pins to mount the target substrate on the mounting table.

* * * * *